US010586494B2

(12) United States Patent
Bong et al.

(10) Patent No.: US 10,586,494 B2
(45) Date of Patent: Mar. 10, 2020

(54) SCAN DRIVER, DISPLAY DEVICE, AND METHOD OF DRIVING DISPLAY DEVICE

(71) Applicant: LG Display Co., Ltd., Seoul (KR)

(72) Inventors: Junho Bong, Gwangju (KR); Changheon Kang, Paju-si (KR); Jungmin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 111 days.

(21) Appl. No.: 15/294,361

(22) Filed: Oct. 14, 2016

(65) Prior Publication Data

US 2017/0116926 A1 Apr. 27, 2017

(30) Foreign Application Priority Data

Oct. 23, 2015 (KR) .................. 10-2015-0147981

(51) Int. Cl.
G09G 3/3266 (2016.01)
G11C 19/18 (2006.01)
G11C 19/28 (2006.01)
G09G 3/3233 (2016.01)

(52) U.S. Cl.
CPC ......... *G09G 3/3266* (2013.01); *G11C 19/186* (2013.01); *G11C 19/28* (2013.01); *G09G 3/3233* (2013.01); *G09G 2300/043* (2013.01); *G09G 2300/08* (2013.01); *G09G 2300/0861* (2013.01); *G09G 2310/0251* (2013.01); *G09G 2310/0262* (2013.01); *G09G 2310/0286* (2013.01); *G09G 2310/08* (2013.01)

(58) Field of Classification Search
CPC ............. G09G 3/3266; G09G 2310/08; G09G 3/3275; G09G 2310/0286
See application file for complete search history.

(56) References Cited

U.S. PATENT DOCUMENTS

2009/0256785 A1  10/2009  Sung et al.
2013/0222352 A1*  8/2013  Jeong .................. G09G 3/3266
                                                                  345/205

(Continued)

FOREIGN PATENT DOCUMENTS

CN    102789757 A    11/2012
CN    103285522 A     9/2013
CN    104658475 A     5/2015
(Continued)

OTHER PUBLICATIONS

European Search Report dated Jun. 22, 2017 for European patent application No. 16 19 4063.

(Continued)

*Primary Examiner* — Nelson M Rosario
*Assistant Examiner* — Scott Au
(74) *Attorney, Agent, or Firm* — Polsinelli PC

(57) ABSTRACT

The present disclosure provides a display device including a display panel and a scan driver. The display panel displays an image. The scan driver includes a scan signal generation circuit disposed on one side of the display panel, and an emission signal generation circuit disposed on the other side of the display panel. The emission signal generation circuit outputs an emission signal having at least two Logic High sections in response to an external clock signal and a first scan signal output from the scan signal generation circuit.

17 Claims, 15 Drawing Sheets

(56) References Cited

U.S. PATENT DOCUMENTS

2015/0138180 A1    5/2015  Park et al.
2016/0247456 A1*   8/2016  Lin ..................... G09G 3/3266

FOREIGN PATENT DOCUMENTS

| EP | 2 602 783 A1 | 6/2013 |
| EP | 3 159 883 A1 | 4/2017 |

OTHER PUBLICATIONS

European Search Report dated Mar. 15, 2017 for European patent application No. 16194063.0.
Office Action dated Dec. 17, 2019 issued in corresponding Chinese Application No. 201610918574.6 (22 pages).

* cited by examiner

RELATED ART

140B

140B

140B

140B

140B

SCAN DRIVER, DISPLAY DEVICE, AND METHOD OF DRIVING DISPLAY DEVICE

CROSS-REFERENCE TO RELATED APPLICATION

This application claims the priority benefit of Korean Patent Application No. 10-2015-0147981, filed in the Republic of Korea on Oct. 23, 2015, which is incorporated herein by reference in its entirety for all purposes as if fully set forth herein.

BACKGROUND

Field of the Disclosure

The present disclosure relates to a display device, and more particularly, to a scan driver, a display device, and a method of driving the display device. Although the present disclosure is suitable for a wide scope of applications, it is particularly suitable for implementing a narrow bezel on a display panel.

Description of the Background

With development of information technologies, the display device market is growing. A display device is a medium which enables connection between a user and information. The display device includes an organic light emitting display (OLED), a liquid crystal display (LCD), a plasma display panel (PDP), etc., and it is being widely used these days.

Some of the examples of the display device, such as LCD or OLED, operate in a manner that a selected sub-pixel emits light once a scan signal and a data signal is supplied to sub-pixels included in a display panel.

The display device includes a display panel having a plurality of sub-pixels and a driver for driving the display panel. The driver includes a scan driver for supplying a scan signal (or a gate signal) to the display panel, and a data driver for supplying a data signal to the display panel.

The scan driver is in embedded in the display panel, and, in this case, the scan driver is the form of an integrated circuit (IC) or a in the form of gate in panel (GIP) by performing a thin film transistor (TFT) manufacturing process.

The GIP-type scan driver includes a shift register and an inverter. The shift register receives a clock signal from an external device and generates scan signals sequentially based on the clock signal. The inverter receives an output signal of the shift register and a clock signal, and generates an emission signal based thereon.

However, when existing related art GIP-type scan driver is used, it is difficult to implement a narrow bezel on the display panel due to layout limitation and complexity in the circuits of the shift register and the inverter.

SUMMARY

In one general aspect, there is provided a display device including a display panel and a scan driver. The display panel displays an image. The scan driver includes a scan signal generation circuit disposed on one side of the display panel, and an emission signal generation circuit disposed on the other side of the display panel. The emission signal generation circuit outputs an emission signal having at least two Logic High sections in response to an external clock signal and a first scan signal output from the scan signal generation circuit.

In another general aspect, there is provided a scan driver including a scan signal generation circuit and an emission signal generation circuit. The emission signal generation circuit outputs an emission signal having at least two Logic High sections in response to an external clock signal and a first scan signal output from the scan signal generation circuit.

In yet another general aspect, there is provided a method of driving a display device which includes a display panel for displaying an image and a scan driver, wherein the scan driver includes a scan signal generation circuit disposed on one side of the display panel and an emission signal generation circuit disposed on the other side of the display panel. The method includes outputting, by the emission signal generation circuit, an emission signal having at least two Logic High sections in response to an external clock signal and a first scan signal output from the scan signal generation circuit.

BRIEF DESCRIPTION OF THE DRAWINGS

The accompany drawings, which are included to provide a further understanding of the disclosure and are incorporated on and constitute a part of this specification illustrate aspects of the present disclosure and together with the description serve to explain the principles of the present disclosure.

DETAILED DESCRIPTION

Reference will now be made in detail to aspects of the present disclosure, examples of which are illustrated in the accompanying drawings. Whenever possible, the same reference numbers will be used throughout the drawings to refer to the same or like parts.

Hereinafter, aspects of the present disclosure are described with accompanying drawings.

A display device according to the present disclosure is implemented as a television, a set-top box, a navigation device, a video player, a Blu-ray player, a personal computer (PC), a home theater, a mobile phone, etc. The display device may be selected from among a liquid crystal display, an organic light-emitting diode display device, a quantum dot display device, an electrophoretic indication display device, and a plasma display device, but it is not limited thereto. In the following descriptions, the organic light-emitting diode display device is taken as an example of the display device for convenience of explanation. In addition, except for a gate electrode, transistors may be referred to as a source electrode and a drain electrode, or a drain electrode and a source electrode, depending on the type of the transistors. However, the transistors are herein called first and second electrodes to avoid limitation.

Figure 1:
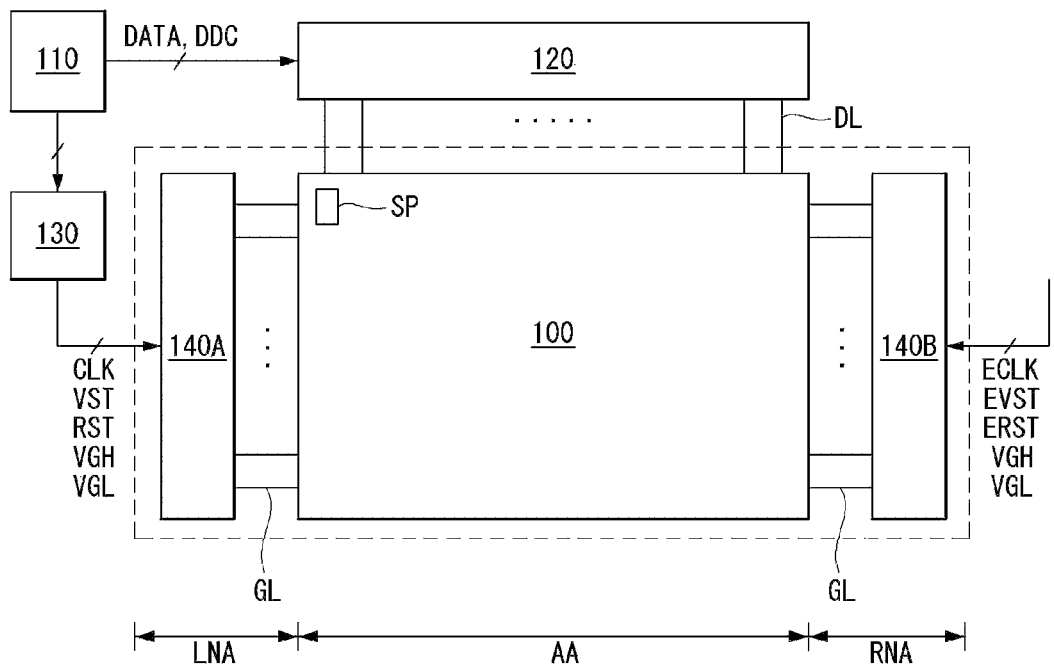
FIG. 1 is a schematic block diagram illustrating a display device.
Figure 2:
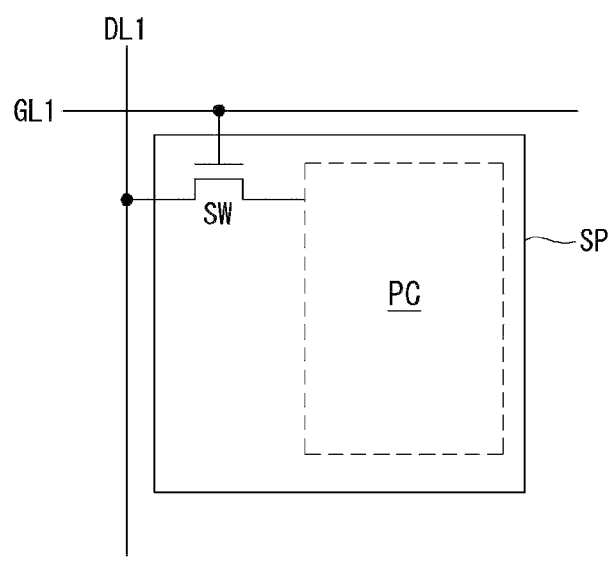
FIG. 2 is a diagram illustrating a structure of a sub-pixel shown in FIG. 1.

FIG. 1 is a schematic block diagram illustrating a display device, and FIG. 2 is a diagram illustrating a sub-pixel shown in FIG. 1.

As illustrated in FIG. 1, a display device includes a display panel 100, a timing controller 110, a data driver 120, and a scan driver 130, 140A, and 140B.

The display panel 100 includes sub-pixels that are connected to each other and respectively defined by data lines DL and scan lines GL which intersect the data lines DL. The display panel 100 is sealed so as to protect at least one film, a substrate, or sub-pixels formed thereon from outdoor air such as moisture and oxygen.

The display panel 100 includes a display area AA, on which sub-pixels are formed, and non-display areas LNA and RNA which are disposed lateral to the display area AA and on which various signal lines or pads are formed. The display panel 100 may be implemented by a top-emission method, a bottom-emission method, or a dual-emission method, depending on the configuration of sub-pixels SP.

As illustrated in FIG. 2, one sub-pixel SP includes a switching transistor SW connected to a scan line GL1 and a data line DL1, and a pixel circuit PC operating in response to a data signal DATA (shown in FIG. 1) which is supplied in response to a scan signal supplied through the switching transistor SW. The pixel circuit PC of the sub pixel SP may be formed to further include a drive transistor, a storage capacitor, an organic light diode (OLED), and various types of compensation circuits.

The timing controller 110 may receive timing signals through an LDVS or TMDS interface receiver circuit connected to a video board. The timing signals may include a vertical synchronization signal, a horizontal synchronization signal, a data enable signal, and a dot clock. With reference to an input timing signal, the timing controller 110 generates timing control signals for controlling operation timing of the data driver 120 and the scan driver 130, 140A, and 140B.

The data driver 120 includes a plurality of source drive integrated circuits (ICs). The source drive ICs are supplied with a data signal DATA and a source timing control signal DDC from the timing controller 110. The source drive ICs convert the form of the data signal DATA from a digital signal into an analog signal in response to the source timing control signal, and supplies the analog signal through the data lines DL of the display panel 100. The source drive ICs are connected to the data lines DL of the display panel 100 by a chip on glass (COG) process or a tape automated bonding (TAB) process.

The scan driver 130, 140A, and 140B may be further defined as a level shifter circuit 130, and a signal generation circuit 140A and 140B, respectively.

The level shifter circuit 130 may be referred to as a power supply unit. Thus, the level shifter circuit 130 may be defined as an independent component not included in the scan driver 130, 140A, and 140B. In the following description, however, the level shifter circuit 130 is depicted as being included in the scan driver 130, 140A, and 140B for convenience of explanation.

The level shifter circuit 130 is formed on an external substrate connected in the form of an IC to the display panel 100. Under the control of the timing controller 110, the level shifter circuit 130 may shift a level of a signal or voltage which is supplied through a clock signal line, a start signal line, a gate high voltage line, and a gate low voltage line. Then, the level shifter circuit 130 supplies the level-shifted signal or voltage to the signal generation circuit 140A and 140B.

The signal generation circuit 140A and 140B are formed in the form of a thin film transistor (TFT) on the display panel 100 in a gate in panel (GIP) method. The signal generation circuit 140A and 140B are respectively formed on the left-hand non-display area LNA and the right-hand non-display area RNA of the display panel 100. The signal generation circuit 140A and 140B are composed of stages which shift and output a scan signal based on a signal or voltage CLK, ECLK, VST, EVST, RST, ERST, VGH, or VGL output from the level shifter. The signal generation circuit 140A and 140B may be configured in various ways with signal lines and voltage lines along which the signal or voltage CLK, ECLK, VST, EVST, RST, ERST, VGH, or VGL is output bypassing the data driver.

The signal generation circuit 140A and 140B can be further defined as a scan signal generation circuit 140A for outputting a scan signal for turning on or off switching transistors included in sub-pixels, and an emission signal generation circuit 140B for outputting an emission signal for turning on or off emission control transistors included in the sub-pixels. The scan signal generation circuit 140A and the emission signal generation circuit 140B may be arranged opposite to the configuration shown in FIG. 1.

Hereinafter, problems of the related art scan driver and examples for solving the problems are explained.

<Related Art Structure>

Figure 3:
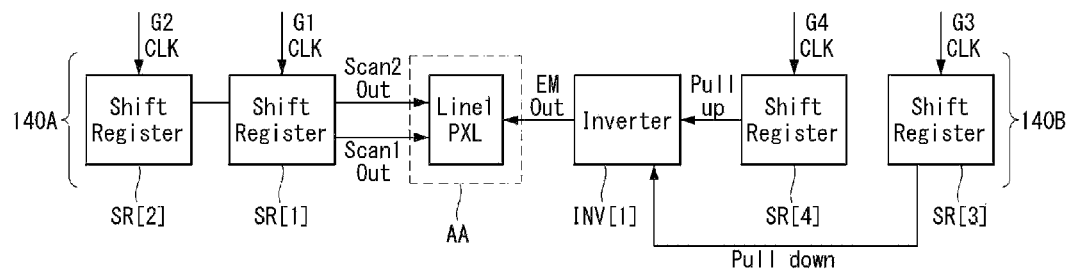
FIG. 3 is a schematic block diagram illustrating part of existing related art scan driver.
Figure 4:
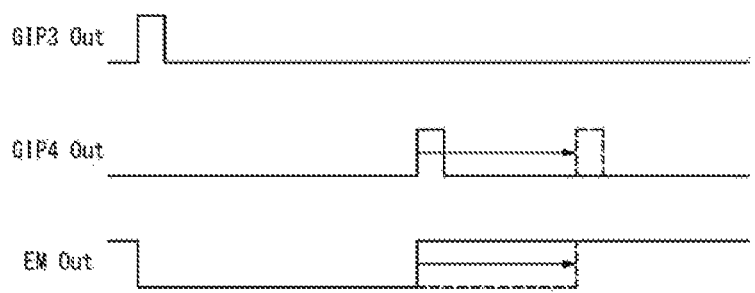
FIG. 4 is a waveform wave illustrating input and output waves in an emission signal generation circuit shown in FIG. 3.
Figure 4:
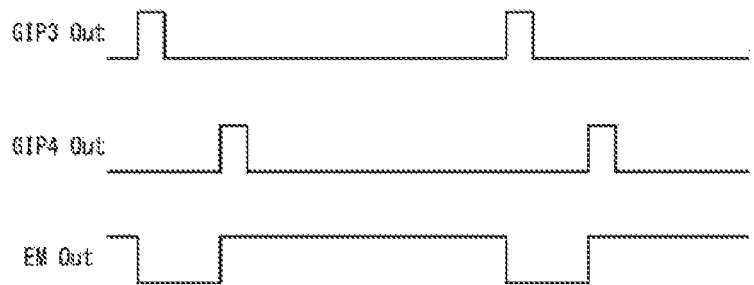

FIG. 3 is a schematic block diagram illustrating part of existing related art scan driver, and FIG. 4 is a waveform view illustrating input and output waveforms of an emission signal generation circuit shown in FIG. 3.

As illustrated in FIG. 3, a signal generation circuit 140A and 140B of the related art scan driver includes a scan signal generation circuit 140A for outputting a scan signal for turning on or off switching transistors included in sub-pixels PXL, and an emission signal generation circuit 140B for outputting an emission signal for turning on or off emission control transistors included in the sub-pixels PXL.

The scan signal generation circuit 140A includes first and second shift registers SR[1] and SR[2] to receive a clock signal and generate sequential scan signals based on the clock signal. The emission signal generation circuit 140B includes a first inverter circuit INV[1] to receive an output signal and a clock signal from third and fourth shift register SR[3] and SR[4] and generate an emission signal based on the output signal and the clock signal. The above configurations of the scan signal generation circuit 140A and the emission signal generation circuit 140B are arranged in the form of multiple stages so as to drive sub-pixels PXL existing on each line.

Sub-pixels PXL existing on one line Line 1 operates based on a first scan signal Scan 1 Out output from the first shift register SR[1], a second scan signal Scan 2 Out output from the second shift register SR[2], and an emission signal EM Out output from the first inverter circuit INV[1].

The emission signal generation circuit 140B outputs the emission signal EM Out based on an output signal from a pull-down transistor of the third shift register SR[3] and an output signal from a pull-up transistor of the fourth shift register SR[4].

As illustrated in FIGS. 3 and 4, the emission signal generation circuit 140B forms a rising edge of a signal output from itself, by synchronizing with a rising edge of an output signal GIP4 output from a pull-up transistor of the fourth shift register SR[4]. Then, the emission signal generation circuit 140B forms a falling edge with regard to a signal output from itself, by synchronizing with a rising edge of an output signal GIP3 Out from the pull-down transistor of the third shift register SR[3].

Due to the above configuration, the emission signal generation circuit 140B needs to vary the output signal GIP4 Out from the pull-up transistor of the fourth shift register SR[4] in order to perform variation PWM of a pulse width of the emission signal EM Out output from the emission signal generation circuit 140B.

The signal generation circuit 140A and 140B of the related art scan driver further includes four shift registers and a single inverter in order to drive sub-pixels existing on a single line Line 1. In particular, the emission signal generation circuit 140B needs to further include two additional shift registers in order to generate an emission signal EM Out increasing circuit complexity and layout limitation.

As a result, the related art scan driver is difficult to secure the design margin due to the circuit complexity and layout limitation, so it is difficult to implement a narrow bezel in the display panel.

First Embodiment

Figure 5:
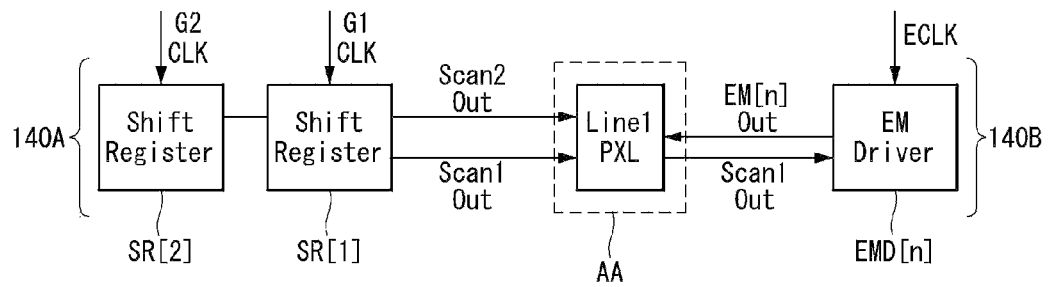
FIG. 5 is a schematic block diagram illustrating part of a scan driver according to a first embodiment of the present disclosure.
Figure 6:
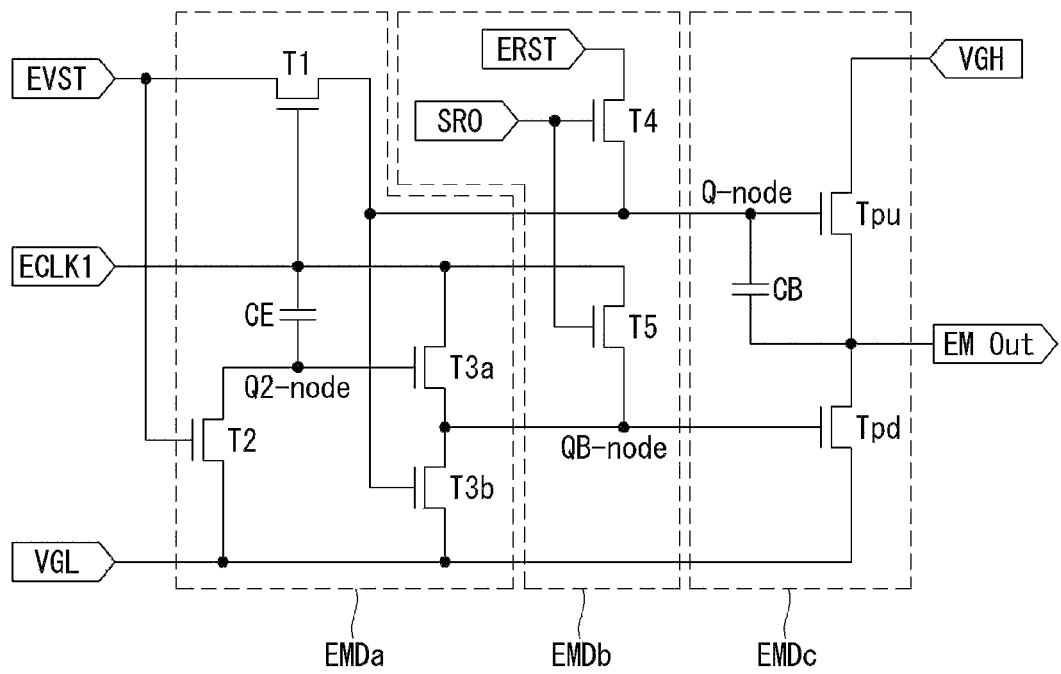
FIG. 6 is a diagram illustrating an emission signal generation circuit according to the first embodiment of the present disclosure.
Figure 7:
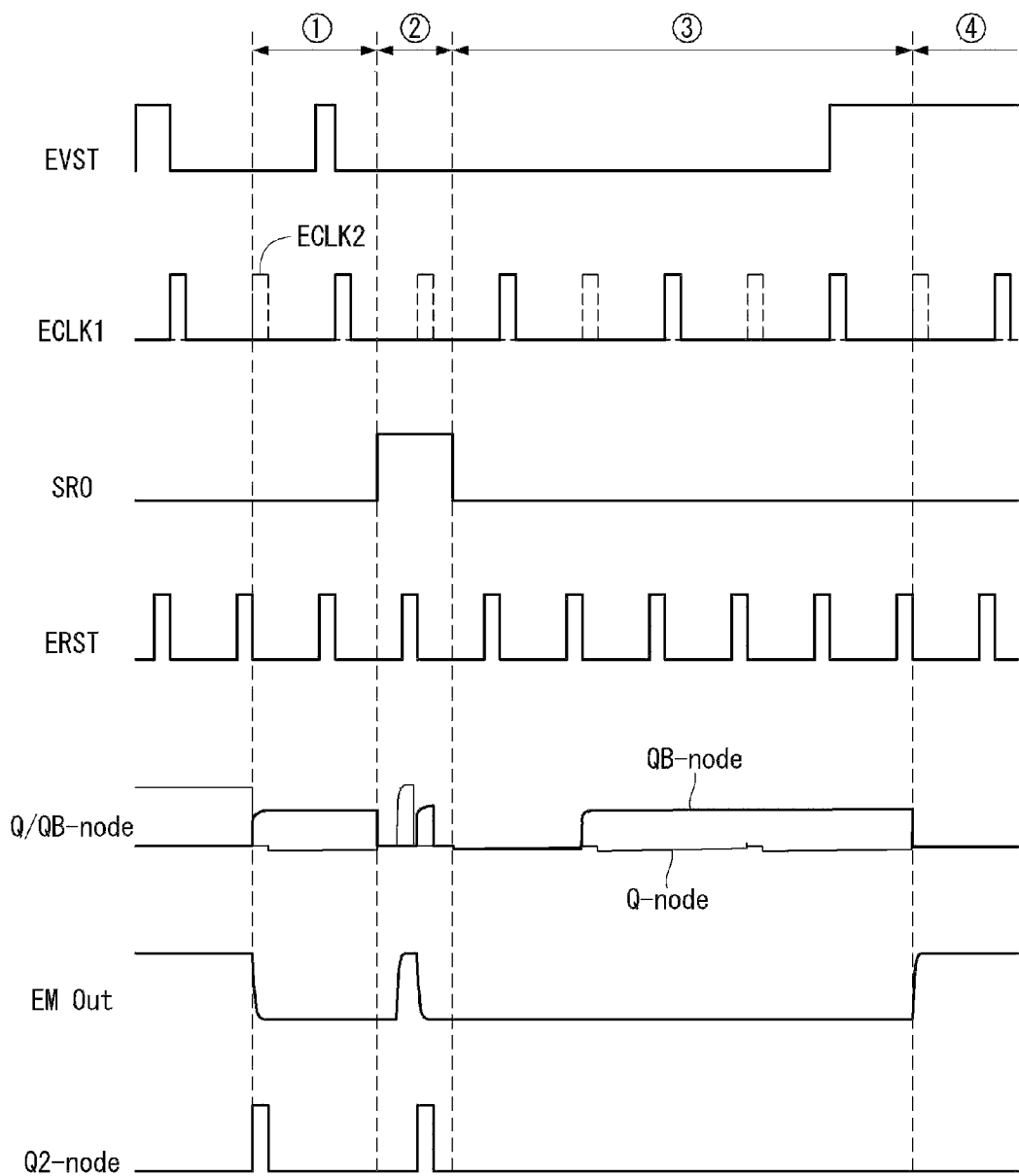
FIG. 7 is a waveform view of input and output waves in the emission signal generation circuit shown in FIG. 6.
Figure 8:
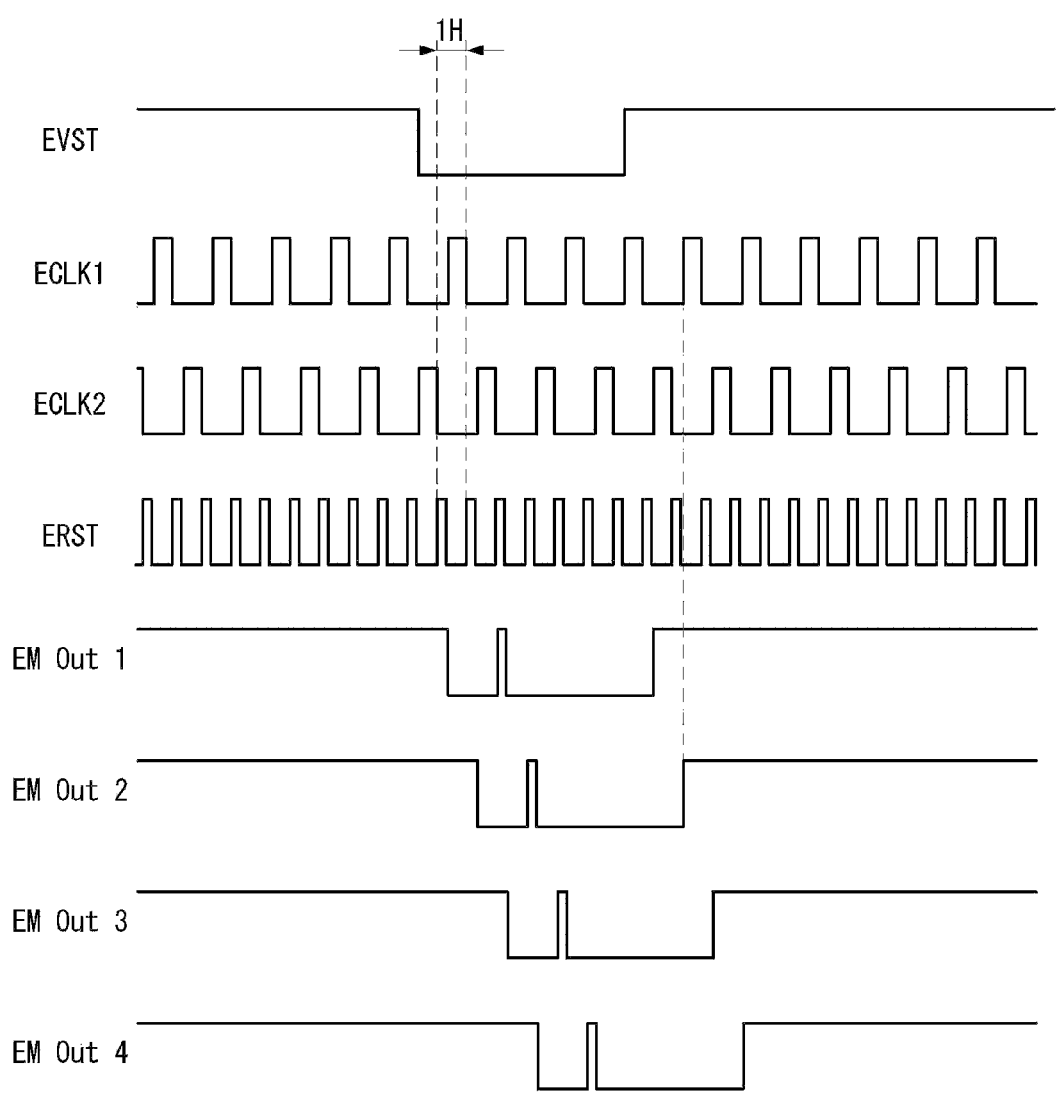
FIG. 8 is a simulation waveform view of the scan driver according to the first embodiment of the present disclosure.
Figure 9:
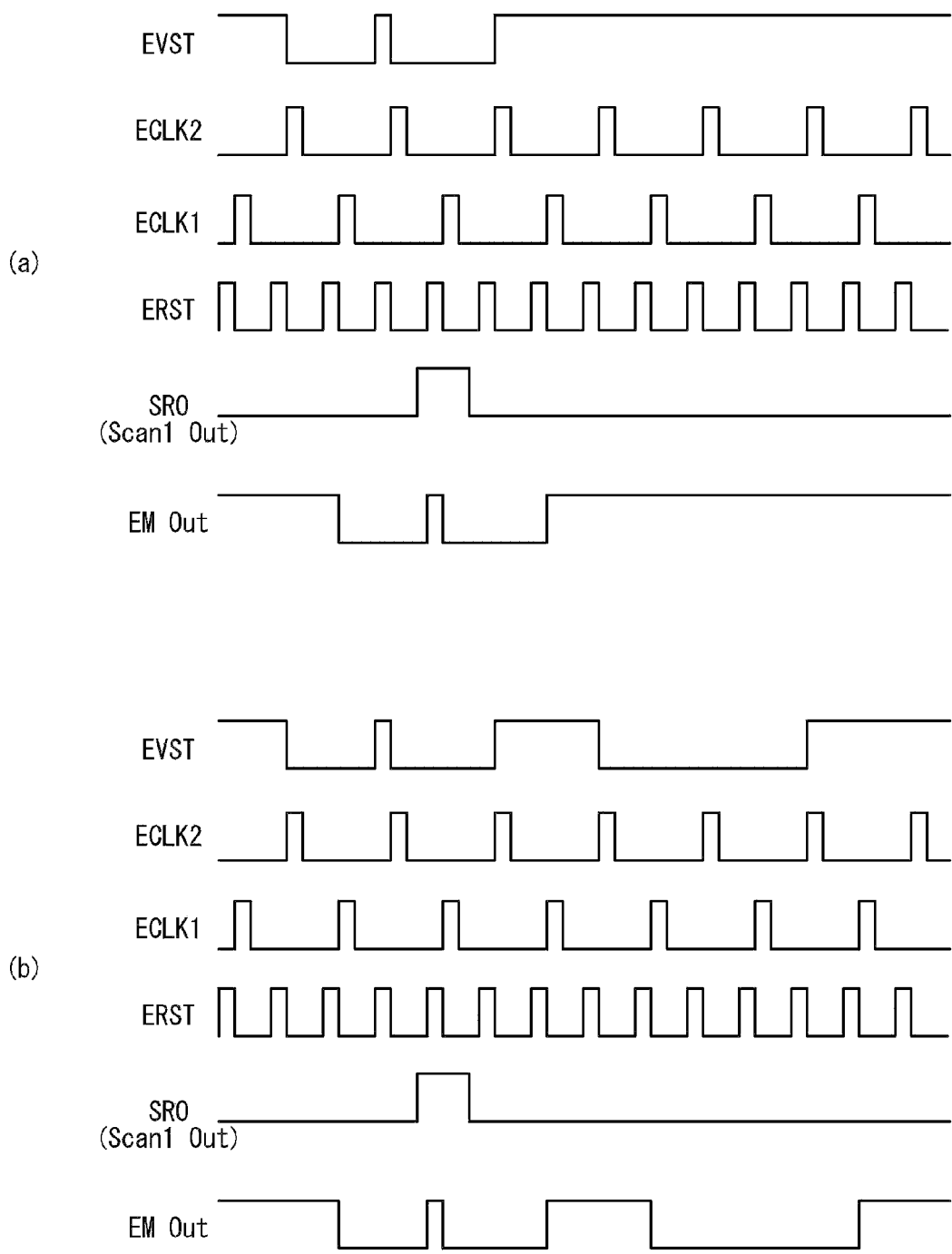
FIG. 9 is a waveform view of pulse-width modulation and outputs of the emission signal generation signal according to the first embodiment of the present disclosure.
Figure 10:
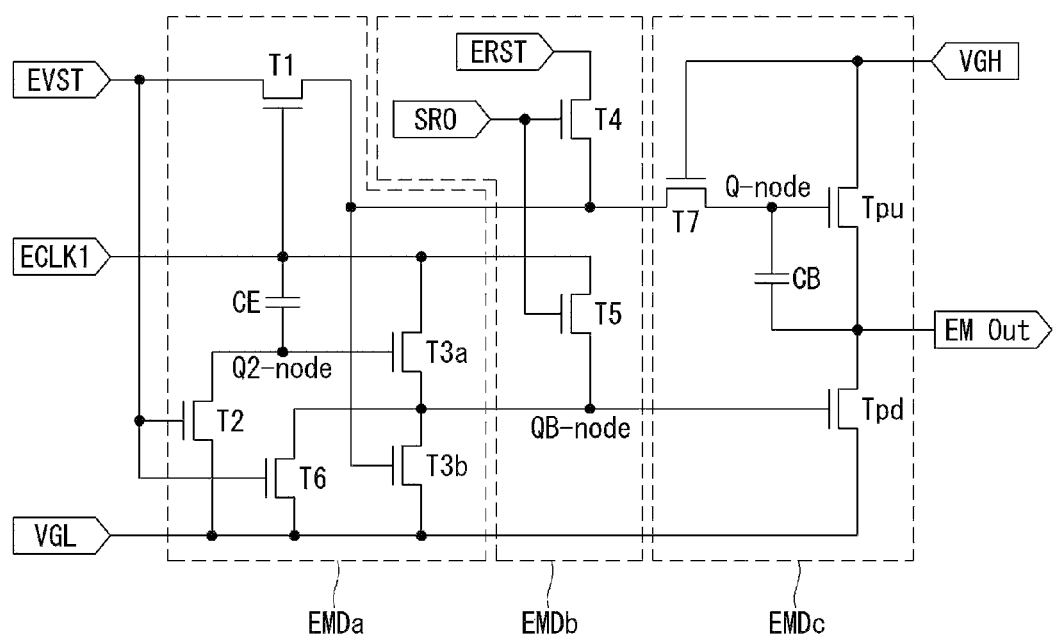
FIG. 10 is a diagram illustrating an emission signal generation circuit according to an exemplary variation of the first embodiment of the present disclosure.

FIG. 5 is a schematic block diagram illustrating part of a scan driver according to a first embodiment of the present disclosure, FIG. 6 is a diagram illustrating an emission signal generation circuit according to the first embodiment of the present disclosure, FIG. 7 is a waveform view illustrating input and output waves of the emission signal generation circuit shown in FIG. 6, FIG. 8 is a simulation waveform view of a scan driver according to the first embodiment of the present disclosure, FIG. 9 shows a waveform view of pulse-width modulation and outputs of the emission signal generation circuit according to the first embodiment of the present disclosure, and FIG. 10 is a diagram of the emission signal generation circuit according to an exemplary variation of the first embodiment of the present disclosure.

As illustrated in FIG. 5, a signal generation circuit 140A and 140B of a scan driver according to the first embodiment of the present disclosure can be further defined as a scan signal generation circuit 140A for outputting a scan signal for turning on or off switching transistors included in sub-pixels PXL, and an emission signal generation circuit 140B for outputting an emission signal for turning on or off emission control transistors included in the sub-pixels PXL.

The scan signal generation circuit 140A includes first and second register circuits SR[1] and SR[2] to receive a clock signal CLK and generate sequential scan signals based on the clock signal CLK. The emission signal generation circuit 140B includes an N-th EM driver EMD[N] to receive a clock signal ECLK and generate an emission signal based on the clock signal ECLK. The above configurations of the scan signal generation circuit 140A and the emission signal generation circuit 140B are arranged in the form of multiple stages in order to drive sub-pixels PXL existing on each line.

Sub-pixels existing on one line Line 1 operate based on a first scan signal Scan 1 Out output from the first shift register SR[1], a second scan signal Scan 2 Out output from the second shift register SR[2], and an N-th emission signal EM[N] Out output from the N-th EM driver EMD[N].

The signal generation circuit 140A and 140B of the scan driver according to the first embodiment of the present disclosure further includes two shift registers and a single EM driver in order to drive the sub-pixels PXL existing on one line Line 1. In the scan signal generation circuit 140A, the shift registers are connected dependently. However, the emission signal generation circuit 140B does not need an additional shift register to generate an emission signal EM out, and it can reduce circuit complexity and layout limitation, compared to the configuration of the related art scan driver.

As a result, compared to the related art scan driver, the scan driver according to the first embodiment of the present disclosure reduces the circuit complexity and overcome layout limitation, thereby securing the design margin and overcoming the problems in implementing a narrow bezel. In addition, the scan driver according to the first embodiment of the present disclosure can reduce circuit complexity compared to the related art scan driver, thereby securing a sufficient encapsulation margin and improving a device reliability.

To this end, the emission signal generation circuit 140B is configured to generate the N-th emission signal EM[N] Out based on the clock signal ECLK and an output signal Scant Out output from the first shift register SR[1] of the scan signal generation circuit 140A.

As such, the emission signal generation circuit 140B according to the first embodiment of the present disclosure uses the output signal Scant Out output from the first shift register SR[1] disposed on the opposite side comparing to the related art scan driver. The output signal Scant Out output from the first shift register SR[1] is supplied to the emission signal generation circuit 140B through the display area AA.

Meanwhile, the second shift register SR[2] is disposed on a line on which the first shift register SR[1] is disposed, as illustrated in FIG. 5. That is, the second shift register SR[2] and the first shift register SR[1] drives the same line.

The aforementioned signal generation circuit 140A and 140B operates based on different-phase clock signals. For example, a clock signal CLK supplied to the scan signal generation circuit 140A may be comprised of at least four phases, and a clock signal ECLK supplied to the emission signal generation circuit 140B may be comprised of at least two phases. However, aspects of the present disclosure are not limited thereto.

Hereinafter, a configuration of the emission signal generation circuit 140B according to the first embodiment of the present disclosure is described. The emission signal generation circuit 140B may operate based on an output signal of an (N-x)-th shift register located before the first register circuit (where x is an integer equal to or greater than 1). In the following description, however, the emission signal generation circuit 140B is depicted as operating in response to an output signal of the N-th shift register and a clock signal.

As illustrated in FIG. 6, the emission signal generation circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic High or Logic Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through the output terminal of the emission signal generation circuit, which is disposed at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to a potential of the clock signal in response to a potential of the Q2 node Q2-node. The third transistor B T3b is configured to discharge the QB node to the gate low voltage in response to a potential of the Q node Q-node.

The first transistor T1 is configured such that a gate electrode thereof is connected to an N-th clock signal line (which is depicted as a first clock signal line ECLK1 in the disclosure), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a gate low voltage line VGL, and a second electrode thereof is connected to the Q2 node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode is connected to the gate low voltage line VGL, and a second electrode thereof is connected to the QB node QB-node.

The second circuit EMDb includes a fourth transistor T4 and a fifth transistor T5. The fourth transistor T4 is configured to charge or discharge the Q node Q-node to a potential of a reset signal in response to an output signal of the N-th shift register. The fifth transistor T5 is configured to charge or discharge the QB node QB-node to a potential to a clock signal in response to an output signal of the N-th shift register.

The fourth transistor T4 is configured such that a gate electrode thereof is connected to an output terminal SRO of the N-th shift register, a first electrode thereof is connected to a reset signal line ERST, and a second electrode thereof is connected to the Q node Q-node. The fifth transistor T5 is configured such that a gate electrode thereof is connected to the output terminal SRO of the N-th shift register, a first electrode thereof is connected to the N-th clock signal line ECLK1, and a second electrode thereof is connected to the QB node QB-node.

The third circuit EMDc includes a pull-up transistor Tpu, a pull-down transistor Tpd, and a second capacitor CB. The pull-up transistor Tpu is configured to output a gate high voltage through the output terminal EM Out of the emission signal generation circuit 140B in response to a potential of the Q node Q-node. The pull-down transistor Tpd is configured to output a gate low voltage through the output terminal EM Out of the emission signal generation circuit 140B in response to a potential of the QB node QB-node. The second capacitor CB is configured to cause bootstrap to occur in the output terminal EM Out of the emission signal generation circuit 140B.

The pull-up transistor Tpu is configured such that a gate electrode thereof is connected to the Q node Q-node, a first electrode thereof is connected to a gate high voltage line VGH, and a second electrode thereof is connected to the output terminal EM Out of the emission signal generation circuit 140B. The pull-down transistor Tpd is configured such that a gate electrode thereof is connected to the QB node, a first electrode thereof is connected to the gate low voltage line VGL, and a second electrode thereof is connected to the output terminal EM Out of the emission signal generation circuit 140B. The second capacitor CB is configured such that one end thereof is connected to the Q node Q-node and the other end thereof is connected to the output terminal EM Out of the emission signal generation circuit 140B.

Hereinafter, there is provided descriptions about the operation of the emission signal generation circuit 140B according to the first embodiment of the present disclosure.

As illustrated in FIGS. 6 and 7, when a start signal EVST happens to be at Logic Low and the N-th clock signal ECLK1 happens to be at Logic High, the Q node Q-node is maintained in a discharging state whilst the QB node QB-node is maintained in a charging state. At this point, the pull-up transistor Tpu is turned off and the pull-down transistor Tpd is turned on. Thus, an emission signal at a gate low voltage corresponding to Logic Low is output from the output terminal EM Out of the emission signal generation circuit 140B (see Section ①).

When a scan signal at a gate high voltage corresponding to Logic High is output from the output terminal SRO of the N-th shift register and the rest signal ERST happens to be at Logic High, the Q node Q-node temporarily maintained in the charging state while the QB node QB-node is temporarily maintained in the discharging state. At this point, the pull-up transistor Tpu is turned on and the pull-down transistor Tpd is turned off. Then, when the N-th clock signal ECLK1 happens to be at Logic High, the Q node Q-node is changed to the charging state whilst the QB node is changed to the charging state. At this point, the pull-up transistor Tpu is turned off and the pull-down transistor Tpd is turned on. Thus, an emission signal at a gate high voltage corresponding to Logic High is temporarily output from the output terminal EM Out of the emission signal generation circuit 140B (see Section ②).

When a scan signal at a gate low voltage corresponding to Logic Low is output from the output terminal SRO of the N-th shift register and the N-th clock signal ECLK happens to be at Logic High, the Q node Q-node is maintained in the discharging state while the QB node QB-node is maintained in the charging state. At this point, the pull-up transistor Tpu is turned off and the pull-down transistor Tpd is turned on. Thus, an emission signal at a gate low voltage corresponding to Logic Low is output from the output terminal EM Out of the emission signal generation circuit 140B (see Section ③).

When the start signal EVST happens to be at Logic High and the N-th clock signal ECLK1 happens to be at Logic High, the Q node Q-node is changed to the charging state while the QB node QB-node is changed to the discharging state. Then, the start signal EVST is constantly maintained at Logic High and a scan signal output from the output terminal SRO of the N-th shift register is constantly maintained at a gate low voltage corresponding to Logic Low. At this point, the pull-up transistor Tpu is turned on and the pull-down transistor Tpd is turned off. Thus, the emission signal at a gate high voltage corresponding to Logic High is constantly output from the output terminal of the emission signal generation circuit 140B (see Section ④).

An (N+1)-th clock signal ECLK2, which is shown together with the N-th clock signal ECLK1, is a clock signal supplied to an emission signal generation circuit existing in the next stage. The N-th clock signal ECLK1 and the (N+1)-th clock signal ECLK2 are shown together in FIG. 7 is to show that it is an example in which the emission signal generation circuit operates based on a two-phase clock signal.

As shown in the simulation result of FIG. 8, the emission signal generation circuit according to the first embodiment of the present disclosure may output emission signals EM_OUT1 to EM_OUT4 that are sequentially output for each line in response to a start signal EVST, a first clock signal ECLK1, a second clock signal ECLK2, and a reset signal ERST.

As compared in (a) and (b) in FIG. 9, it is possible to adjust a pulse width of the emission signal EM Out output from the emission signal generation circuit simply by adjusting a pulse width of the start signal EVST, which is one of the clock signals. As explained with the above-described operational characteristics, a pulse width of the emission signal EM Out output from the emission signal generation circuit is adjusted such that the QB node is maintained at Logic High or Logic Low depending on the logic state of the start signal EVST.

As illustrated in FIG. 10, the emission signal generation circuit according to an exemplary variation of the first embodiment of the present disclosure further includes a sixth transistor T6 in the first circuit EMDa and a third transistor T7 in the third circuit EMDc.

The sixth transistor T6 is configured to discharge the QB node QB-node to a gate low voltage so that an output can be stably output through the output terminal EM Out of the emission signal generation circuit 140B in response to a start signal. The seventh transistor T7 is configured to (physically) divide the Q node Q-node into one side and the other side so that an output can be stably output through the output terminal EM Out of the emission signal generation circuit 140 in response to a gate high voltage.

The sixth transistor T6 is configured such that a gate electrode thereof is connected to the start signal line EVST, a first electrode thereof is connected to the gate low voltage line VGL, and a second electrode thereof is connected to the QB node QB-node. The seventh transistor T7 is configured such that a gate electrode thereof is connected to the gate high voltage line VGH, a first electrode thereof is connected to one side of the Q node Q-node being adjacent to the second electrode of the fourth transistor T4, and a second electrode thereof is connected to the other side of the Q node Q-node being adjacent to one end of the second capacitor CB.

The emission signal generation circuit according to the exemplary variation of the first embodiment of the present disclosure is the same as that of the first embodiment, except for further including the seventh transistor T7 in the third circuit EMDc. Accordingly, detailed descriptions about the configuration, connection, and driving method thereof are the same as that of the first embodiment, and thus, they are not herein provided.

The emission signal generation circuit according to the first embodiment of the present disclosure may be implemented using various types of circuits with the same operational characteristics even though it has different circuit structure and connection relationships. Hereinafter, other embodiments are described with the same operational characteristics as those of the first embodiment. Thus, the detailed descriptions about the operational characteristics are omitted, and the circuit structure and connection relationships of the different embodiments will be mainly explained.

Second Embodiment

Figure 11:
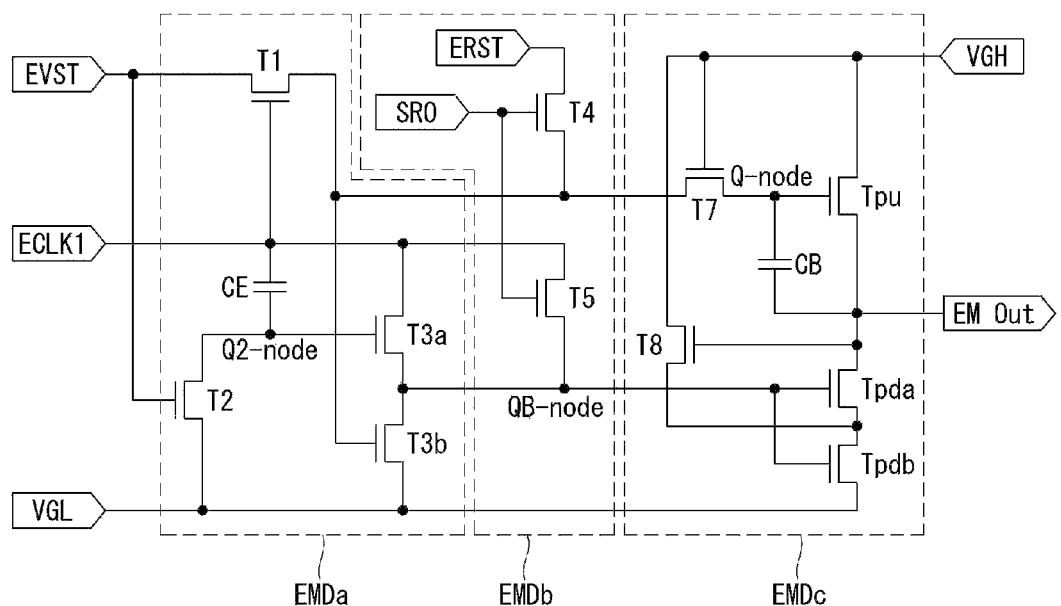
FIG. 11 is a diagram illustrating an emission signal generation circuit according to a second embodiment of the present disclosure.

FIG. 11 is a diagram illustrating an emission signal generation circuit according to a second embodiment of the present disclosure.

As illustrated in FIG. 11, an emission signal generation circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic High or Logic Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output from the output terminal of the emission signal generation circuit which is disposed at a previous stage. The second transistor T2 is configured to transfer a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in the other words, by synchronizing with the clock signal). The third transistor A T3a is configured to charge or discharge the QB node QB-node to a potential of the clock signal in response to a potential of the Q2 node Q2-node. The third transistor B T3b is configured to discharge the QB node QB-node to the gate low voltage in response to the Q node Q-node.

The first transistor T1 is configured such that a gate electrode thereof is connected to an N-th clock signal line (which is depicted as a first clock signal line ECLK1 in the present disclosure), a first electrode thereof is connected to a start signal line (which is depicted as an emission signal generation circuit existing in the first stage), and a second electrode thereof is connected to the Q node Q-node. The second transistor T2 is configured such that a gate electrode thereof is connected to the start signal line, a first electrode thereof is connected to a gate low voltage line VGL, and a second electrode is connected to the Q2 node Q2-node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode thereof is connected to the gate low voltage line VGL, and a second electrode thereof is connected to the QB node QB-node.

The second circuit EMDb includes a fourth transistor T4 and a fifth transistor T5. The fourth transistor T4 is configured to charge or discharge the Q node Q-node to a potential to a reset signal in response to an output signal of the N-th shift register. The fifth transistor T5 is configured to charge or discharge the QB node to a potential of a clock signal in response to the output signal of the N-th shift register.

The fourth transistor T4 is configured such that a gate electrode thereof is connected to an output terminal SRO of the N-th shift register, a first electrode thereof is connected to a reset signal line ERST, and a second electrode thereof is connected to a first electrode of a seventh transistor T7. The fifth transistor T5 is configured such that a gate electrode thereof is connected to the output terminal SRO of the N-th shift register, a first electrode thereof is connected to the N-th clock signal line ECLK1, and a second electrode thereof is connected to the QB node QB-node.

The third circuit EMDc includes a pull-up transistor Tpu, a first pull-down transistor Tpda, a second pull-down transistor Tpdb, a second capacitor CB, a seventh transistor T7, and an eighth transistor T8. The pull-up transistor Tpu is configured to output a gate high voltage through an output terminal EM Out of the emission signal generation circuit 140B in response to a potential of the Q node Q-node. The first and second pull-down transistors Tpda and Tpdb are each configured to output a gate low voltage through the output terminal EM Out of the emission signal generation circuit 140B in response to a potential of the QB node QB-node. The second capacitor CB is configured to cause bootstrap the output terminal EM Out of the emission signal generation circuit 140B. The seventh transistor T7 is configured to (physically) divide the Q node Q-node into one side and the other side so that an output can be stably output through the output terminal EM Out of the emission signal generation circuit 140B in response to a gate high voltage. The eighth transistor T8 is configured to stabilize nodes connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The seventh transistor T7 is configured such that a gate electrode thereof is connected to the gate high voltage line VGH, a first electrode thereof is connected to the one side of the Q node Q-node being adjacent to the second electrode of the fourth transistor T4, and a second electrode thereof is connected to the other side of the Q node Q-node being adjacent to one end of the second capacitor CB. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

Third Embodiment

Figure 12:
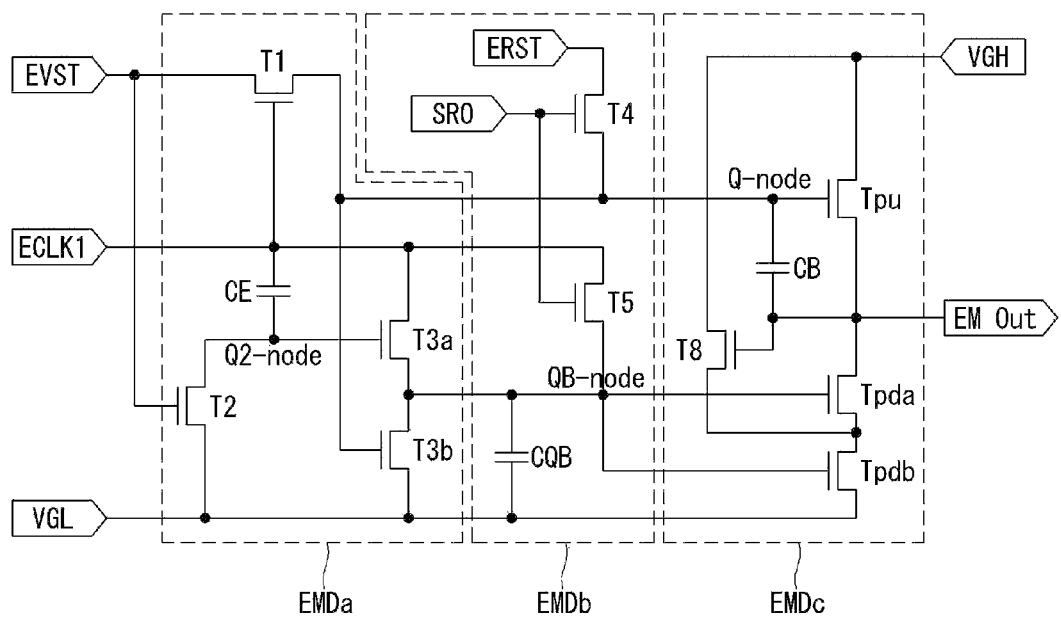
FIG. 12 is a diagram illustrating an emission signal generation circuit according to a third embodiment of the present disclosure.

FIG. 12 is a diagram illustrating an emission signal generation circuit according to a third embodiment of the present disclosure.

As illustrated in FIG. 12, an emission signal generated circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic High or Logic Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through an output terminal of the emission signal generation circuit which is located at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to potential of the clock signal in response to a potential of the Q2 node Q2-node. The third transistor B T3b is configured to discharge the QB node to the gate low voltage in response to a potential of the Q node Q-node.

The first transistor T1 is configured such that a gate electrode thereof is connected to an N-th clock signal line (which is depicted as a first clock signal line ECLK1 in the present disclosure), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a gate low voltage line VGL, and a second electrode thereof is connected to the Q2 node Q2-node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode thereof is connected to the gate low voltage line VGL, and a second electrode thereof is connected to the QB node QB-node.

The second circuit EMDb includes a fourth transistor T4, a fifth transistor T5, and a third capacitor CQB. The fourth transistor T4 is configured to charge or discharge the Q node Q-node to a potential of a reset signal in response to an output signal of the N-th shift register. The fifth transistor T5 is configured to charge or discharge the QB node QB-node to a potential to a clock signal in response to an output signal of the N-th shift register. The third capacitor CQB is configured to maintain a potential of the QB node QB-node at Logic High or Logic Low so that an emission signal can be stably output through the output terminal EMO of the emission signal generation circuit 140B.

The fourth transistor T4 is configured such that a gate electrode thereof is connected to an output terminal SRO of the N-th shift register, a first electrode thereof is connected to a reset signal line ERST, and a second electrode thereof is connected to the Q node Q-node. The fifth transistor T5 is configured such that a gate electrode thereof is connected to the output terminal SRO of the N-th shift register, a first electrode thereof is connected to the N-th clock signal line ECLK1, and a second electrode thereof is connected to the QB node QB-node. The third capacitor CQB is configured such that one end thereof is connected to the QB node QB-node and the other end thereof is connected to the gate low voltage line VGL.

The third circuit EMDc includes a pull-up transistor Tpu, a first pull-down transistor Tpda, a second pull-down transistor Tpdb, a second capacitor CB, and an eighth transistor T8. The pull-up transistor Tpu is configured to output a gate high voltage through an output terminal EM Out of the emission signal generation circuit 140B in response to a potential of the Q node Q-node. The first and second pull-down transistors Tpda and Tpdb are each configured to output a gate low voltage in response to a potential of the QB node QB-node through the output terminal EM Out of the emission signal generation circuit 140B. The second capacitor CB is configured to cause bootstrap to occur in the output terminal EM Out of the emission signal generation circuit 140B. The eighth transistor T8 is configured to stabilize a node connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

Fourth Embodiment

Figure 13:
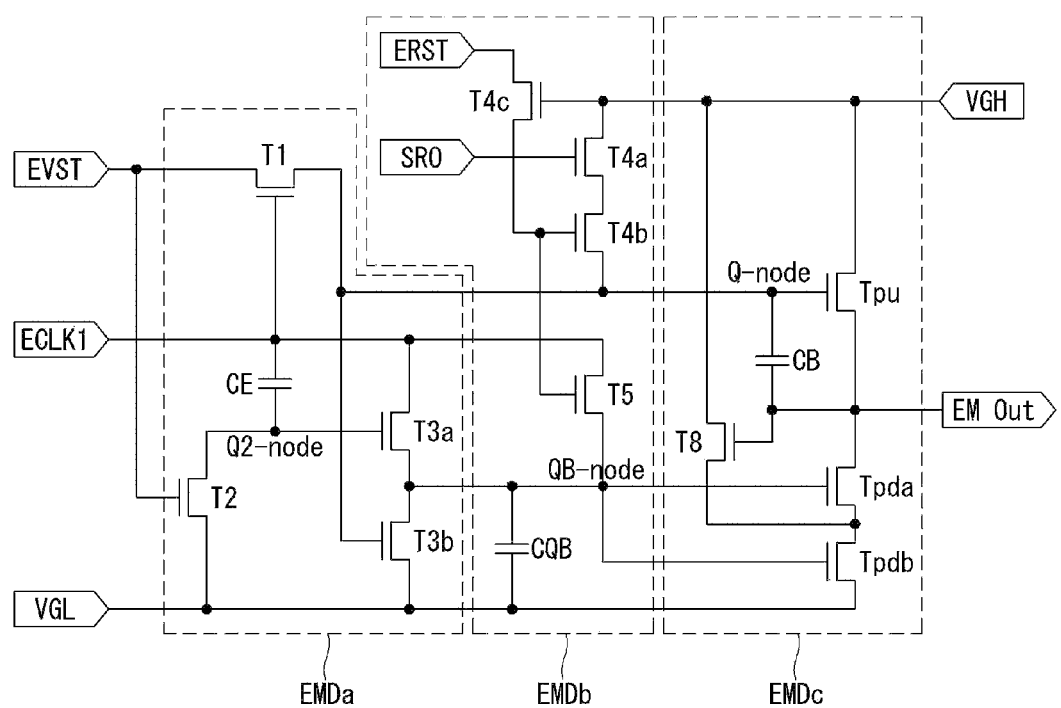
FIG. 13 is a diagram illustrating an emission signal generation circuit according to a fourth embodiment of the present disclosure.

FIG. 13 is a diagram illustrating an emission signal generation circuit according to a fourth embodiment of the present disclosure.

As illustrated in FIG. 13, an emission signal generated circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for controlling a Logic High or Logic Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through an output terminal of the emission signal generation circuit which is located at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to a potential of the clock signal in response to a potential of the Q2 node Q2-node. The third transistor B T3b is configured to discharge the QB node to a gate low voltage in response to a potential of the Q node Q-node.

The first transistor T1 is configured such that a gate electrode thereof is connected to an N-th clock signal line (which is depicted as a first clock signal line ECLK1 in the present disclosure), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a gate low voltage line VGL, and a second electrode thereof is connected to the Q2 node Q2-node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode thereof is connected to the gate low voltage line VGL, and a second electrode thereof is connected to the QB node QB-node.

The second circuit EMDb includes three fourth transistors T4a to T4c, a fifth transistor T5, and a third capacitor CQB. The fourth transistors T4a to T4c are each configured to charge the Q node Q-node to a gate high voltage in response to an output signal of the N-th shift register and a gate high voltage. The fifth transistor T5 is configured to charge or discharge the QB node QB-node to a potential to a clock signal in response to an output signal of the N-th shift register. The third capacitor CQB is configured to maintain a potential of the QB node QB-node at Logic High or Logic Low so that an emission signal can be stably output through the output terminal EMO of the emission signal generation circuit 140B.

The fourth transistor A T4a is configured such that a gate electrode thereof is connected to an output terminal SRO of the N-th shift register, a first electrode thereof is connected to a gate high voltage line VGH, and a second electrode thereof is connected to a first electrode of a fourth transistor B T4b. The fourth transistor B T4b is configured such that a gate electrode thereof is connected to a second electrode of the fourth transistor C T4c, a first electrode thereof is connected to the second electrode of the fourth transistor A T4a, and a second electrode thereof is connected to the Q node Q-node. The fourth transistor C T4c is configured such that a gate electrode thereof is connected to the gate high voltage line VGH, a first electrode thereof is connected to a reset signal line ERST, and a second electrode thereof is connected to the gate electrode of the fourth transistor B T4b. The fifth transistor T5 is configured such that a gate electrode thereof is connected to the second electrode of the fourth transistor C T4c (or the gate electrode of the fourth transistor B T4b), a first electrode thereof is connected to the N-th clock signal line ECLK1, and a second electrode is connected to the QB node QB-node. The third capacitor CQB is configured such that one end thereof is connected to the QB node QB-node and the other end thereof is connected to the gate low voltage line VGL.

The third circuit EMDc includes a pull-up transistor Tpu, a first pull-down transistor Tpda, a second pull-down transistor Tpdb, a second capacitor CB, and an eighth transistor T8. The pull-up transistor Tpu is configured to output a gate high voltage through an output terminal EM Out of the emission signal generation circuit 140B in response to a potential of the Q node Q-node. The first and second pull-down transistors Tpda and Tpdb are each configured to output a gate low voltage in response to a potential of the QB node QB-node through the output terminal EM Out of the emission signal generation circuit 140B. The second capacitor CB is configured to cause bootstrap at the output terminal EM Out of the emission signal generation circuit 140B. The eighth transistor T8 is configured to stabilize nodes connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

Fifth Embodiment

Figure 14:
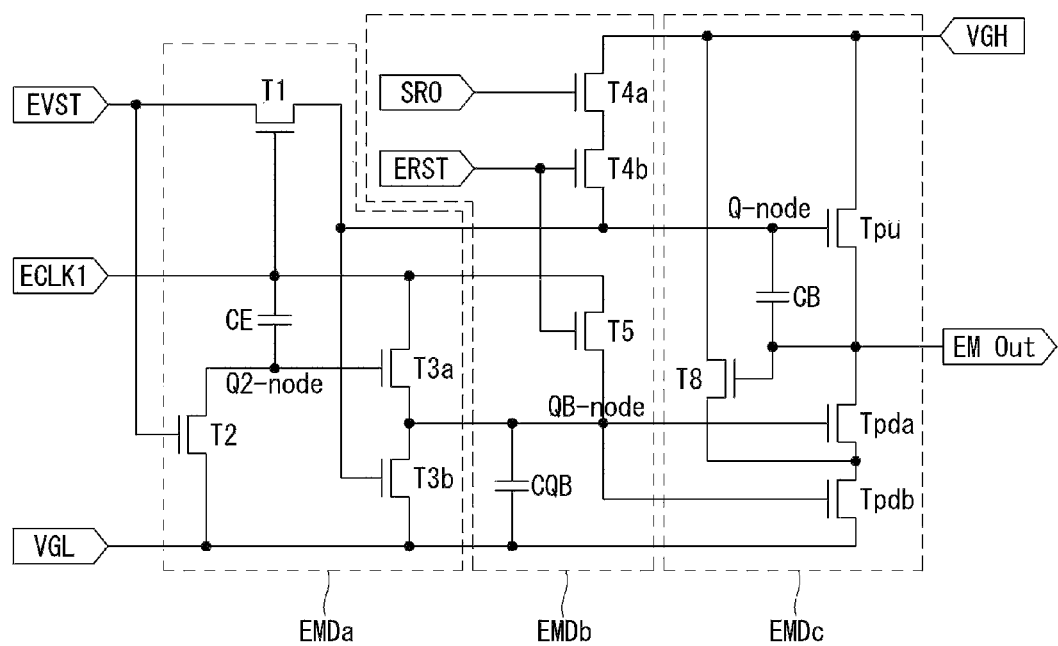
FIG. 14 is a diagram illustrating an emission signal generation circuit according to a fifth embodiment of the present disclosure.

FIG. 14 is a diagram illustrating an emission signal generation circuit according to a fifth embodiment of the present disclosure.

As illustrated in FIG. 14, an emission signal generated circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic-High or Logic-Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through an output terminal of the emission signal generation circuit which is located at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to potential of the clock signal in response to a potential of the Q2 node Q2-node.

The third transistor B T3b is configured to discharge the QB node to a gate low voltage in response to a potential of the Q node Q-node.

The first transistor T1 is configured such that a gate electrode thereof is connected to an N-th clock signal line (which is depicted as a first clock signal line ECLK1 in embodiments), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a gate low voltage line VGL, and a second electrode thereof is connected to the Q2 node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode is connected to the gate low voltage line VGL, and a second electrode thereof is connected to the QB node QB-node.

The second circuit EMDb includes two fourth transistors T4a and T4b, a fifth transistor T5, and a third capacitor CQB. The fourth transistors T4a and T4b are each configured to charge the Q node Q-node to a gate high voltage in response to an output signal of an N-th shift register and a reset signal. The fifth transistor T5 is configured to charge or discharge the QB node QB-node to a potential to a clock signal in response to an output signal of the N-th shift register. The third capacitor CQB is configured to maintain a potential of the QB node QB-node at Logic High or Logic Low so that an emission signal can be stably output through the output terminal EMO of the emission signal generation circuit 140B.

A fourth transistor A T4a is configured such that a gate electrode thereof is connected to an output terminal SRO of the N-th shift register, a first electrode thereof is connected to a gate high voltage line VGH, and a second electrode thereof is connected to a first electrode of a fourth transistor B T4b. The fourth transistor B T4b is configured such that a gate electrode thereof is connected to a reset signal line ERST, a first electrode thereof is connected to the second electrode of the fourth transistor A T4a, and a second electrode thereof is connected to the Q node Q-node. The fifth transistor T5 is configured such that such that a gate electrode thereof is connected to the reset signal line ERST, a first electrode thereof is connected to an N-th clock signal line ECLK1, and a second electrode thereof is connected to the QB node QB-node. The third capacitor CQB is configured such that one end thereof is connected to the QB-node and the other end thereof is connected to the gate low voltage line VGL.

The third circuit EMDc includes a pull-up transistor Tpu, a first pull-down transistor Tpda, a second pull-down transistor Tpdb, a second capacitor CB, and an eighth transistor T8. The pull-up transistor Tpu is configured to output a gate high voltage through an output terminal EM Out of the emission signal generation circuit 140B in response to a potential of the Q node Q-node. The first and second pull-down transistors Tpda and Tpdb are each configured to output a gate low voltage through the output terminal EM Out of the emission signal generation circuit 140B in response to a potential of the QB node QB-node. The second capacitor CB is configured to cause bootstrap to occur in the output terminal EM Out of the emission signal generation circuit 140B. The eighth transistor T8 is configured to stabilize a node connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

Sixth Embodiment

Figure 15:
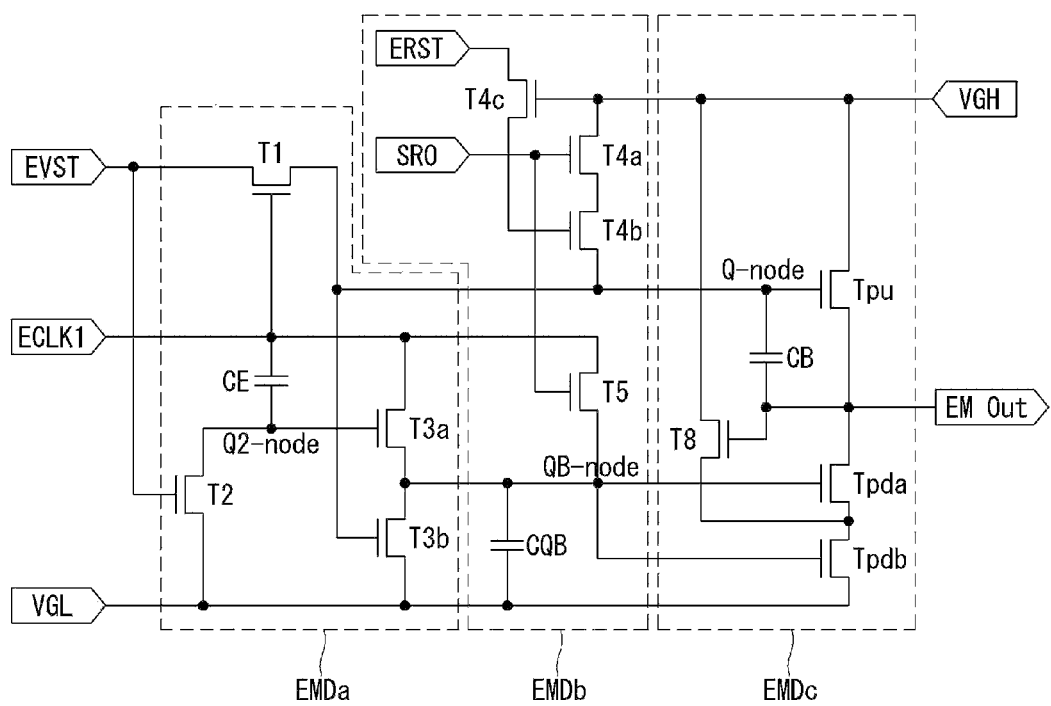
FIG. 15 is a diagram illustrating an emission signal generation circuit according to a sixth embodiment of the present disclosure.

FIG. 15 is a diagram illustrating an emission signal generation circuit according to a sixth embodiment of the present disclosure.

As illustrated in FIG. 15, an emission signal generated circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic-High or Logic-Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through an output terminal of the emission signal generation circuit which is located at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to a potential of the clock signal in response to a potential of the Q2 node Q2-node. The third transistor B T3b is configured to discharge the QB node to a gate low voltage in response to a potential of the Q node Q-node.

The first transistor T1 is configured such that a gate electrode thereof is connected to an N-th clock signal line (which is depicted as a first clock signal line ECLK1 in embodiments), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a low voltage line VGL, and a second electrode thereof is connected to the Q2 node Q2-node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode thereof is connected to the gate low voltage line VGL, and a second electrode thereof is connected to the QB node QB-node.

The second circuit EMDb includes three fourth transistors T4a to T4c, a fifth transistor T5, and a third capacitor CQB. The fourth transistors T4a to T4c are each configured to charge the Q node Q-node to a gate high voltage in response to an output signal of the N-th shift register and a gate high voltage. The fifth transistor T5 is configured to charge or discharge the QB node QB-node to a potential to a clock signal in response to an output signal of the N-th shift register. The third capacitor CQB is configured to maintain a potential of the QB node QB-node at Logic High or Logic Low so that an emission signal can be stably output through the output terminal EMO of the emission signal generation circuit 140B.

The fourth transistor A T4a is configured such that a gate electrode thereof is connected to an output terminal SRO of the N-th shift register, a first electrode thereof is connected to a gate high voltage line VGH, and a second electrode thereof is connected to a first electrode of a fourth transistor B T4b. The fourth transistor B T4b is configured such that a gate electrode thereof is connected to a second electrode of the fourth transistor C T4c, a first electrode thereof is connected to the second electrode of the fourth transistor A T4a, and a second electrode thereof is connected to the Q node Q-node. The fourth transistor C T4c is configured such that a gate electrode thereof is connected to the gate high voltage line VGH, a first electrode thereof is connected to a reset signal line ERST, and a second electrode thereof is connected to the gate electrode of the fourth transistor B T4b. The fifth transistor T5 is configured such that a gate electrode thereof is connected to the output terminal SRO of the N-th shift register, a first electrode thereof is connected to the N-th clock signal line ECLK1, and a second electrode is connected to the QB node QB-node. The third capacitor CQB is configured such that one end thereof is connected to the QB node QB-node and the other end thereof is connected to the gate low voltage line VGL.

The third circuit EMDc includes a pull-up transistor Tpu, a first pull-down transistor Tpda, a second pull-down transistor Tpdb, a second capacitor CB, and an eighth transistor T8. The pull-up transistor is Tpu configured to output a gate high voltage through an output terminal EM Out of the emission signal generation circuit 140B in response to a potential of the Q node Q-node. The first and second pull-down transistors Tpda and Tpdb are each configured to output a gate low voltage in response to a potential of the QB node QB-node through the output terminal EM Out of the emission signal generation circuit 140B. The second capacitor CB is configured to cause bootstrap to occur in the output terminal EM Out of the emission signal generation circuit 140B. The eighth transistor T8 is configured to stabilize a node connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

Seventh Embodiment

Figure 16:
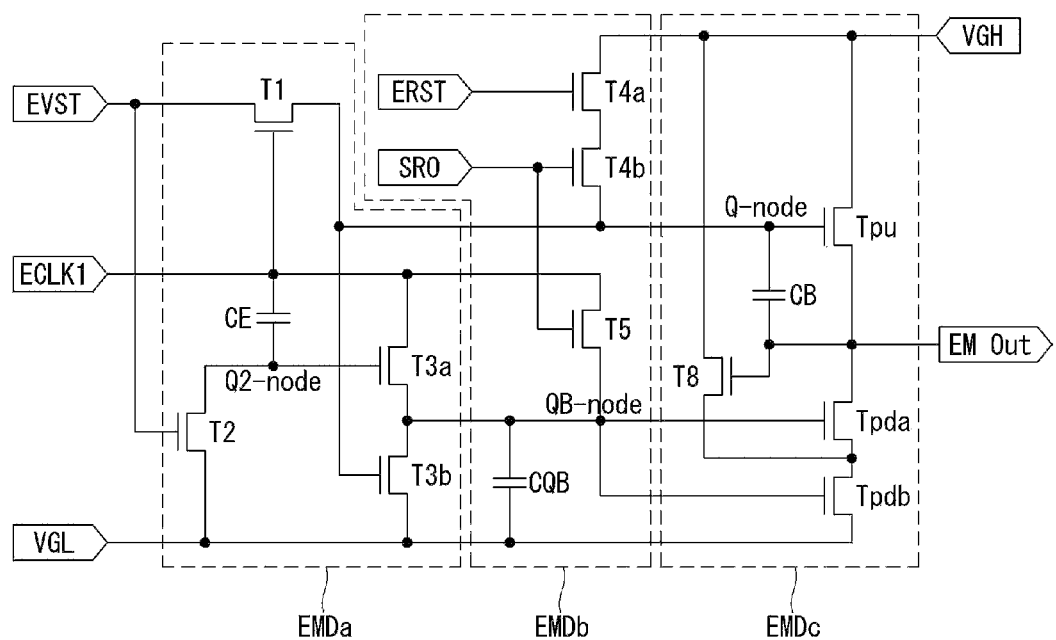
FIG. 16 is a diagram illustrating an emission signal generation circuit according to a seventh embodiment of the present disclosure.

FIG. 16 is a diagram illustrating an emission signal generation circuit according to a seventh embodiment of the present disclosure.

As illustrated in FIG. 16, an emission signal generated circuit 140B includes a first circuit EMDa for controlling charging and discharging of a Q node Q-node and a QB node QB-node, a second circuit EMDb for controlling charging and discharging of the Q node Q-node and the QB node QB-node, and a third circuit EMDc for outputting a Logic-High or Logic-Low emission signal through an output terminal EMO of the emission signal generation circuit 140B.

The first circuit EMDa includes a first transistor T1, a second transistor T2, a first capacitor CE, a third transistor A T3a, and a third transistor B T3b. The first transistor T1 is configured to charge the Q node Q-node to a potential of a start signal in response to a clock signal. The start signal may be replaced by a signal output through an output terminal of the emission signal generation circuit which is located at a previous stage. The second transistor T2 is configured to transmit a gate low voltage to the other end of the first capacitor CE in response to the start signal. The other end of the first capacitor CE may be defined as a Q2 node Q2-node. The first capacitor CE is configured to turn on the third transistor A T3a by using bootstrap of a clock signal (in other words, by synchronizing with the clock signal). The third transistor A T3a is configured to charge or discharge the QB node QB-node to a potential of the clock signal in response to a potential of the Q2 node Q2-node. The third transistor B T3b is configured to discharge the QB node to a gate low voltage in response to a potential of the Q node Q-node.

The first transistor T1 is configured such that a gate electrode thereof is connected to an N-th clock signal line (which is depicted as a first clock signal line ECLK1 in the present disclosure), a first electrode thereof is connected to a start signal line (which is depicted as an emission signal generation circuit existing in a first stage), and a second electrode thereof is connected to the Q node Q-node. The second transistor T2 is configured such that a gate electrode thereof is connected to the start signal line, a first electrode thereof is connected to a gate low voltage line VGL, and a second electrode thereof is connected to the Q2 node Q2-node. The first capacitor CE is configured such that one end thereof is connected to the clock signal line ECLK1 and the other end thereof is connected to the Q2 node Q2-node. The third transistor A T3a is configured such that a gate electrode thereof is connected to the Q2 node Q2-node, a first electrode thereof is connected to the N-th clock signal line ECLK1, and a second electrode thereof is connected to the QB node QB-node. The third transistor B T3b is configured such that a gate electrode thereof is connected to the Q node Q-node, a first electrode thereof is connected to the gate low voltage line VGL, and a second electrode thereof is connected to the QB node QB-node.

The second circuit EMDb includes two fourth transistors T4a to T4b, a fifth transistor T5, and a third capacitor CQB. The fourth transistors T4a to T4b are each configured to charge the Q node Q-node to a gate high voltage in response to an output signal of the N-th shift register and a reset signal. The fifth transistor T5 is configured to charge or discharge the QB node QB-node to a potential to a clock signal in response to an output signal of the N-th shift register. The third capacitor CQB is configured to maintain a potential of the QB node QB-node at Logic High or Logic Low so that an emission signal can be output through the output terminal EMO of the emission signal generation circuit 140B.

The fourth transistor A T4a is configured such that a gate electrode thereof is connected to a reset signal line ERST, a first electrode thereof is connected to a gate high voltage line VGH, and a second electrode thereof is connected to a first electrode of a fourth transistor B T4b. The fourth transistor B T4b is configured such that a gate electrode thereof is connected to an output terminal SRO of the N-th shift register, a first electrode thereof is connected to the second electrode of the fourth transistor A T4a, and a second electrode thereof is connected to the Q node Q-node. The fifth transistor T5 is configured such that a gate electrode thereof is connected to the reset signal line ERST, a first electrode thereof is connected to the N-th clock signal line ECLK1, and a second electrode is connected to the QB node QB-node. The third capacitor CQB is configured such that one end thereof is connected to the QB node QB-node and the other end thereof is connected to the gate low voltage line VGL.

The third circuit EMDc includes a pull-up transistor Tpu, a first pull-down transistor Tpda, a second pull-down transistor Tpdb, a second capacitor CB, and an eighth transistor T8. The pull-up transistor Tpu is configured to output a gate high voltage through an output terminal EM Out of the emission signal generation circuit 140B in response to a potential of the Q node Q-node. The first and second pull-down transistors Tpda and Tpdb are each configured to output a gate low voltage in response to a potential of the QB node QB-node through the output terminal EM Out of the emission signal generation circuit 140B. The second capacitor CB is configured to cause bootstrap to occur in the output terminal EM Out of the emission signal generation circuit 140B. The eighth transistor T8 is configured to stabilize a node connected to electrodes of the pull-down transistors Tpda and Tpdb in response to a potential of the output terminal EM Out of the emission signal generation circuit 140B.

The pull-up transistor Tpu is configured such that a gate electrode thereof is connected to the Q node Q-node, a first electrode thereof is connected to the gate high voltage line VGH, and a second electrode thereof is connected to the output terminal EM Out of the emission signal generation circuit 140B. The first pull-down transistor Tpda is configured such that a gate electrode thereof is connected to the QB node QB-node, a first electrode thereof is connected to a second electrode of the second pull-down transistor Tpdb, and a second electrode thereof is connected to the output terminal EM Out of the emission signal generation circuit 140B. The second pull-down transistor Tpdb is configured such that a gate electrode thereof is connected to the QB node QB-node, a first electrode thereof is connected to the gate low voltage line VGL, and a second electrode thereof is connected to the first electrode of the first pull-down transistor Tpda. The second capacitor CB is configured such that one end thereof is connected to the Q node Q-node and the other end thereof is connected to the output terminal EM Out of the emission signal generation circuit 140B. The eighth transistor T8 is configured such that a gate electrode thereof is connected to the output terminal EM Out of the emission signal generation circuit 140B, a first electrode thereof is connected to the gate high voltage line VGH, and a second electrode thereof is connected to a node located between the first electrode of the first pull-down transistor Tpda and the second electrode of the second pull-down transistor Tpdb.

The above-described scan driver may be applied to a display device which is implemented by sub-pixels in the following circuit structure.

Figure 17:
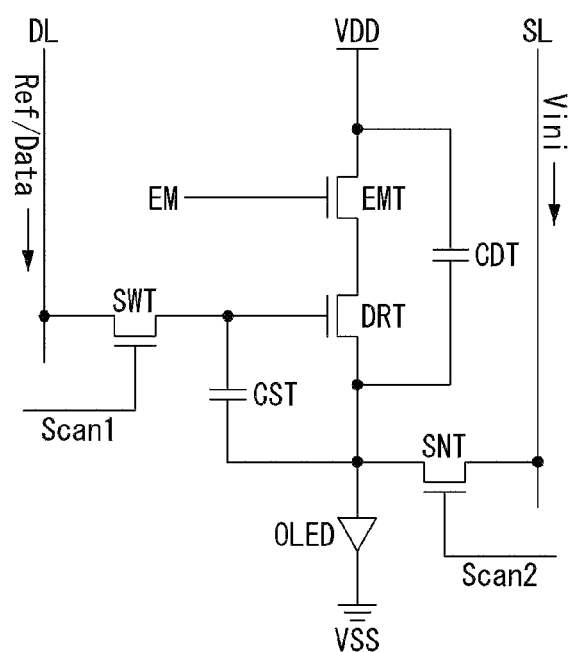
FIG. 17 is a diagram illustrating details of the sub-pixel shown in FIG. 2.
Figure 18:
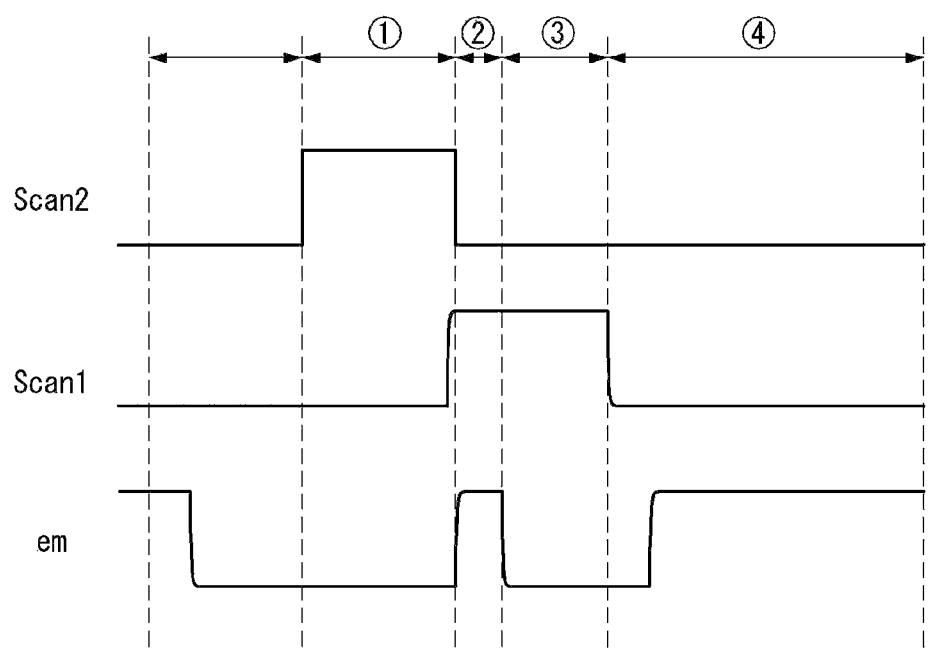
FIG. 18 is a waveform view showing an output waveform of the scan driver according to the present disclosure and a node voltage of a driving transistor.

FIG. 17 is a diagram illustrating details of a sub-pixel shown in FIG. 2, and FIG. 18 is a waveform view illustrating an output waveform of a scan driver and a node voltage of a driving transistor according to the present disclosure.

Hereinafter, a circuit structure of a sub-pixel according to the present disclosure.

As illustrated in FIG. 17, a sub-pixel has a circuit structure including four transistors, two storage capacitors, and an organic light emitting diode OLED. The four transistors include a switching transistor SWT, an emission control transistor EMT, a driving transistor DRT, and a sensing transistor SNT. The two storage capacitors include a first storage capacitor CST and a second storage capacitor CDT.

The switching transistor SWT is configured to transfer a reference voltage Ref or a data voltage Data to one end of the first storage capacitor CST. The switching transistor SWT is configured such that a gate electrode thereof is connected to a first scan line Scan1, a first electrode thereof is connected to a data line DL, and a second electrode thereof is connected to one end of the first storage capacitor CST and to a gate electrode of the driving transistor DRT.

The emission control transistor EMT is configured to control supplying of a first power so as to control actual emitting duration of the OLED. The emission control transistor EMT is configured such that a gate electrode thereof is connected to an emission signal line EM, a first electrode thereof is connected to a first power line VDD, and a second electrode thereof is connected to a first electrode of the driving transistor DRT.

The driving transistor DRT is configured to generate a driving current in response to a data voltage stored in the first storage capacitor CST, the driving current which causes the OLED to emit light. The driving transistor DRT is configured such that a gate electrode thereof is connected to one end of the first storage capacitor CST, a first electrode thereof is connected to the second electrode of the emission control transistor EMT, and a second electrode thereof is connected to an anode electrode of the OLED.

The sensing transistor SNT is configured to supply an initial voltage Vini to a sensing node so as not just to perform initialization, but to sense characteristics of the driving transistor DRT and the OLED (for example, a threshold voltage and a current mobility). The sensing transistor SNT is configured such that a gate electrode thereof is connected to a second scan line Scan2, a first electrode thereof is connected to a sensing line SL, and a second electrode thereof is connected to the second electrode of the driving transistor DRT, to the anode electrode of the OLED, and to a sensing node connected to the first storage capacitor CST.

The first storage capacitor CST is configured to transfer a stored data voltage to the gate electrode of the driving transistor DRT. The first storage capacitor CST is configured such that one end thereof is connected to the gate electrode of the driving transistor DRT and the other end is connected to a sensing node.

The second storage capacitor CDT is configured to improve driving efficiency by a driving current in a manner that variation of a source electrode is reflected by variation of the gate electrode of the driving transistor DRT when the reference voltage Ref is changed into the data voltage Data. The second storage capacitor CDT is configured such that one end thereof is connected to a first power line VDD and the other end thereof is connected to the second electrode of the driving transistor DRT.

The OLED is configured to emit light in response to a driving current generated by the driving transistor DRT. The OLED is configured such that an anode electrode thereof is connected to the sensing node and a cathode electrode thereof is connected to a second power line VSS.

Hereinafter, the operation of a sub-pixel according to the present disclosure is described.

As illustrated in FIGS. 17 and 18, an emission signal em remains at Logic Low, and a second scan signal Scan 2 at a gate high voltage is output through an output terminal SRO[2] of a second shift register. Then, a sensing node (or a source node) of the driving transistor DRT is initialized to an initial voltage Vini (see Section ①).

The emission signal em remains at Logic Low, a first scan signal Scan 1 at a gate high voltage is output through an output terminal SRO[1] of a first shift register, and then the emission signal em is changed to Logic High (a first emission signal). Then, the driving transistor DRT performs sampling (e.g., sampling a threshold voltage) (see Section ②).

The first scan signal Scan 1 at the gate high voltage, which is output through the output terminal SRO[1] of the first shift register, is maintained, and the emission signal em is changed to Logic Low. Then, a reference voltage Vref supplied through the data line DL is changed into a data voltage Data and programmed to the first storage capacitor CST (see Section ③).

A scan signal Scan 1 at a gate low voltage is output through the output terminal SRO[N] of the first shift register, and the emission signal em is changed to Logic High (a second emission signal). Then, the driving transistor DRT generates a driving current in response to the data voltage Data programmed to the first storage capacitor CST, and the OLED emits light in response to the driving current (see Section ④).

The above-described sub-pixel needs an emission signal having at least two Logic High sections in order to perform sampling operation ② and emission operation ④. An emission signal em in the emission operation ④ is generated by an emission signal generation circuit of a scan driver according to the first embodiment of the present disclosure.

In the example shown in FIG. 18, an emission signal em is generated having a first signal with a short Logic High section and a second signal with a Logic High section, which is longer than that of the first signal. In addition, in the example shown in FIG. 18, a Logic High section of the first scan signal Scan 1 partly overlaps the Logic High section of the second scan signal Scan 2, and the first Logic High section of the emission signal em overlaps the Logic Low section of the first scan signal Scan 1. However, the waveform shown in FIG. 18 is merely an example, and it may vary with a clock signal and a reset signal.

As above, the present disclosure can remove the need of an additional shift register provided in a display device to generate an emission signal, thereby reducing circuit complexity and layout limitation. As a result, the present disclosure reduces circuit complexity of a scan driver to thereby overcome layout limitation and secure sufficient design margin, improving difficulties of implementing a narrow bezel. In addition, the present disclosure reduces circuit complexity of a scan driver to thereby secure sufficient encapsulation margin, improving device reliability. Furthermore, the present disclosure is able to adjust a pulse width of an emission signal by means of a clock signal to thereby reduce a lateral current, adjusting an initial time sufficiently and thus enabling stable driving operation.

It will be apparent to those skilled in the art that various modifications and variations can be made in the present disclosure without departing from the sprit or scope of the disclosure. Thus, it is intended that the present disclosure covers the modifications and variations of this disclosure provided they come within the scope of appended claims and their equivalents.

What is claimed is:

1. A display device comprising:
   a display panel displaying an image at a display area; and
   a scan driver comprising a scan signal generation circuit on a first side of the display panel and an emission signal generation circuit on a second side of the display panel, the second side being opposite to the first side in a direction along which a scan line travels,
   wherein the scan signal generation circuit includes first and second shift register circuits sequentially generating first and second scan signals based on first and second clock signals, and the first shift register circuit outputs the first scan signal to the scan line on the first side, and
   wherein the emission signal generation circuit outputs an emission signal having at least two Logic High sections to the display area of the display panel in response to an external clock signal and receives the first scan signal directly from the scan line travelling through the display area of the on the second side.

2. The display device of claim 1, wherein the emission signal generation circuit comprises:
a first circuit comprising first to third transistors and a first capacitor to charge and discharge a Q node and QB node;
a second circuit comprising fourth and fifth transistors to charge and discharge the Q node and the QB node;
a third circuit comprising a pull-up transistor, a pull-down transistor, and a second capacitor to output a Logic High emission signal or a Logic Low emission signal through an output terminal of the emission signal generation circuit.

3. The display device of claim 2, wherein the first transistor configured such that a gate electrode thereof is connected to an N-th clock signal line, a first electrode thereof is connected to a start signal line, and a second electrode thereof is connected to the Q node;
the second transistor configured such that a gate electrode thereof is connected to the start signal line, a first electrode thereof is connected to a gate low voltage line, and a second electrode thereof is connected to a Q2 node;
the first capacitor configured such that one end thereof is connected to a clock signal line and the other end thereof is connected to the Q2 node; and
a third transistor comprising a first third transistor A and a second third transistor B, wherein the first third transistor A is configured such that a gate electrode thereof is connected to the Q2 node, a first electrode thereof is connected to the N-th clock signal line, and a second electrode thereof is connected to the QB node, while the second third transistor B is configured such that a gate electrode thereof is connected to the Q node, a first electrode thereof is connected to the gate low voltage line, and a second electrode thereof is connected to the QB node.

4. The display device of claim 3, wherein the pull-up transistor configured such that a gate electrode thereof is connected to the Q node, a first electrode thereof is connected to a gate high voltage line, and a second electrode thereof is connected to the output terminal of the emission signal generation circuit;
the pull-down transistor configured such that a gate electrode thereof is connected to the QB node, a first electrode thereof is connected to the gate low voltage line, and a
second electrode thereof is connected to the output terminal of the emission signal generation circuit; and
the second capacitor configured such that one end thereof is connected to the Q node and the other end thereof is connected to the output terminal of the emission signal generation circuit.

5. The display device of claim 4, wherein the first circuit comprises a sixth transistor configured such that a gate electrode thereof is connected to the start signal line, a first electrode thereof is connected to the gate low voltage line, and a second electrode thereof is connected to the QB node, and
the third circuit comprises a seventh transistor configured such that a gate electrode thereof is connected to the gate high voltage line, a first electrode thereof is connected to one side of the Q node being adjacent to the second electrode of the fourth transistor, and a second electrode thereof is connected to the other side of the Q node being adjacent to one side of the second capacitor.

6. The display device of claim 4, wherein the pull down transistor comprises a first pull-down transistor and a second pull-down transistor, wherein the first pulldown transistor is configured such that a gate electrode thereof is connected to the QB node, and a second electrode thereof is connected to the output terminal of the emission signal generation circuit, while the second pull-down transistor is configured such that a gate electrode thereof is connected to the QB node, a first electrode thereof is connected to the gate low voltage line, and a second electrode thereof is connected to a first electrode of the first pull-down transistor;
a seventh transistor configured such that a gate electrode thereof is connected to the gate high voltage line, a first electrode thereof is connected to one side of the Q node being adjacent to the second electrode of the fourth transistor, and a second electrode thereof is connected to the other side of the Q node being adjacent to one side of the second capacitor; and
an eighth transistor configured such that a gate electrode thereof is connected to the output terminal of the emission signal generation circuit, a first electrode thereof is connected to the gate high voltage line, and a second electrode thereof is connected to a node between the first electrode of the first pull-down transistor and the second electrode of the second pull-down transistor.

7. The display device of claim 4, wherein the pull-down transistor configured to comprise a first pull-down transistor and a second pull-down transistor, wherein the first pull-down transistor is configured such that a gate electrode thereof is connected to the QB node and a second electrode thereof is connected to the output terminal of the emission signal generation circuit, while the second pull-down transistor is configured such that a gate electrode thereof is connected to the QB node, a first electrode thereof is connected to the gate low voltage line, and a second electrode thereof is connected to a first electrode of the first pulldown transistor; and
an eighth transistor configured such that a gate electrode thereof is connected to the output terminal of the emission signal generation circuit, a first electrode thereof is connected to the gate high voltage line, and a second electrode thereof is connected to a node between the first electrode of the first pull-down transistor and the second electrode of the second pull-down transistor.

8. The display device of claim 5, wherein the fourth transistor configured such that a gate electrode thereof is connected to an output terminal of an N-th shift
register circuit of the scan signal generation circuit, a first electrode thereof is connected to a reset signal line, and a second electrode thereof is connected to the Q node; and
a fifth transistor configured such that a gate electrode thereof is connected to the output terminal of the N-th shift register of the scan signal generation circuit, a first electrode thereof
is connected to the N-th clock signal line, and a second electrode thereof is connected to the QB node.

9. The display device of claim 5, wherein the second circuit comprises:
a first fourth transistor A configured such that a gate electrode thereof is connected to an output terminal of an N-th shift register of the scan signal generation circuit, and a first electrode thereof is connected to the gate high voltage line;

a second fourth transistor B configured such that a first electrode thereof is connected to a second electrode of the fourth transistor A, and a second electrode thereof is connected to the Q node; and a third fourth transistor C configured such that a gate electrode thereof is connected to the gate high voltage line, a first electrode thereof is connected to a reset signal line, and a second electrode thereof is connected to the gate electrode of the fourth transistor B.

10. The display device of claim 5, wherein the second circuit comprises:
a first fourth transistor A configured such that a gate electrode thereof is connected to an output terminal of an N-th shift register of the scan signal generation circuit, and a first electrode thereof is connected to the gate high voltage line;
a second fourth transistor B configured such that a gate electrode thereof is connected to a reset signal line, a first electrode thereof is connected to a second electrode of the fourth transistor A, and a second electrode thereof is connected to the Q node.

11. The display device of claim 5, wherein the second circuit comprises:
a first fourth transistor A configured such that a gate electrode thereof is connected to an output terminal of an N-th shift register of the scan signal generation circuit, and a first electrode thereof is connected to the gate high voltage line;
a second fourth transistor B configured such that a first electrode thereof is connected to a second electrode of the fourth transistor A, and a second electrode thereof is connected to the Q node; and
a third fourth transistor C configured such that a gate electrode thereof is connected to the gate high voltage line, and a second electrode thereof is connected to a gate electrode of the fourth transistor B.

12. The display device of claim 5, wherein the second circuit comprises:
a first fourth transistor A configured such that a gate electrode thereof is connected to a reset signal line, and a first electrode thereof is connected to the gate high voltage line; and
a second fourth transistor B configured such that a gate electrode thereof is connected to an output terminal of an N-th shift register of the scan signal generation circuit, a first electrode thereof is connected to a second electrode of the fourth transistor A, and a second electrode thereof is connected to the Q node.

13. A scan driver for a display panel comprising:
a scan signal generation circuit on a first side of the display panel having a display area; and
an emission signal generation circuit on a second side of the display panel, the second side being opposite to the first side in a direction along which a scan line travels,
wherein the scan signal generation circuit includes first and second shift register circuits sequentially generating first and second scan signals based on first and second clock signals, and the first shift register circuit outputs the first scan signal to the scan line on the first side, and
wherein the emission signal generation circuit outputs an emission signal having at least two Logic High sections to the display area of the display panel in response to an external clock signal and receives the first scan signal directly from the scan line travelling through the display area of the on the second side.

14. The scan driver of claim 13, wherein the emission signal generation circuit comprises:
a first circuit comprising first to third transistors and a first capacitor to charge and discharge a Q node and a QB node;
a second circuit comprising fourth and fifth transistors to charge and discharge the Q node and the QB node; and
a third circuit comprising a pull-up transistor, a pull-down transistor, and a second capacitor to output a Logic High emission signal or a Logic Low emission signal through an output terminal of the emission signal generation circuit.

15. The scan driver of claim 14, wherein the first transistor configured such that a gate electrode thereof is connected to an N-th clock signal line, a first electrode
thereof is connected to a start signal line, and a second electrode thereof is connected to the Q node;
the second transistor configured such that a gate electrode thereof is connected to the start signal line, a first electrode thereof is connected to a gate low voltage line, and a second electrode thereof is connected to a Q2 node;
the first capacitor configured such that one end thereof is connected to a clock signal line and the other end thereof is connected to the Q2 node; and
a third transistor configured to comprise a first third transistor A and a second third transistor B, wherein the third transistor A is configured such that a gate electrode thereof is connected to the Q2 node, a first electrode thereof is connected to the N-th clock signal line, and a second electrode thereof is connected to the QB node, while the third transistor B is configured such that a gate electrode thereof is connected to the Q node, a first electrode thereof is connected to the gate low voltage line, and a second electrode thereof is connected to the QB node.

16. A method of driving a display device which includes a display panel for displaying an image at a display area and a scan driver, wherein the scan driver includes a scan signal generation circuit having first and second shift register circuits disposed on a first side of the display panel and an emission signal generation circuit disposed on a second side of the display panel, and wherein the second side is opposite to the first side in a direction along which a scan line travels, the first and second shift register circuits sequentially generate first and scan signals based on first and second clock signals, and the first shift register circuit outputs the first scan signal to the scan line on the first side, the method comprising:
outputting, by the emission signal generation circuit, an emission signal having at least two Logic High sections to the display area of the display panel in response to an external clock signal; and
receiving, by the emission signal generation circuit, the first scan signal that is output from the first shift register circuit of the scan signal generation circuit directly from the scan line travelling through the display area on the second side.

17. The method of claim 16, wherein a first Logic High section of the emission signal overlaps a Logic High section of the first scan signal.

* * * * *